United States Patent [19]

Ellis

[11] Patent Number: 5,550,728
[45] Date of Patent: Aug. 27, 1996

[54] CHARGE PUMP CONVERTER STRUCTURE

[75] Inventor: Denis Ellis, Limerick, Ireland

[73] Assignee: Analog Devices, Inc., Norwood, Mass.

[21] Appl. No.: 228,722

[22] Filed: Apr. 18, 1994

[51] Int. Cl.⁶ .................................................. H02M 3/18
[52] U.S. Cl. ................................................ 363/60; 363/56
[58] Field of Search ......................... 363/60, 61, 53, 363/56

[56] References Cited

U.S. PATENT DOCUMENTS

| | | | |
|---|---|---|---|
| 4,636,930 | 1/1987 | Bingham et al. | 363/60 |
| 4,679,134 | 7/1987 | Bingham et al. | 363/61 |
| 4,777,577 | 10/1988 | Bingham et al. | 363/60 |
| 4,797,899 | 1/1989 | Fuller et al. | 375/7 |
| 4,809,152 | 2/1989 | Bingham et al. | 363/61 |
| 4,897,774 | 1/1990 | Bingham et al. | 363/61 |
| 5,237,209 | 8/1993 | Brewer | 307/110 |
| 5,260,607 | 11/1993 | Kinbara | 363/56 X |

OTHER PUBLICATIONS

Dorf, Richard, et al., *The Electrical Engineering Handbook*, CRC Press, Ann Arbor, 1993, pp. 708–711.

Weste, Neil, et al., *Principles of CMOS VLSI Deaign*, Addison–Wesley Publishing, New York, 1993, pp. 113–116 & 132–133 & 142–156.

Baker, L, et al., "A *Waffle Layout Technique Strengthens the DSD Hardness of the NMOS Output Transistor*", ESO/ESD Symposium Proceedings, pp. 175–181.

*Primary Examiner*—Peter S. Wong
*Assistant Examiner*—Y. J. Han
*Attorney, Agent, or Firm*—Koppel & Jacobs

[57] ABSTRACT

Charge pump structures (100, 110) are disclosed having a reservoir capacitor (40, 86) and a pump capacitor (26, 84) embedded in a switch network. Each of the switches (120) in the network is formed as an MOS transistor having a gate (122) which defines an array of spaced apertures (124) and a plurality of sources (130) and drains (132) each disposed beneath a different one of the apertures.

4 Claims, 3 Drawing Sheets

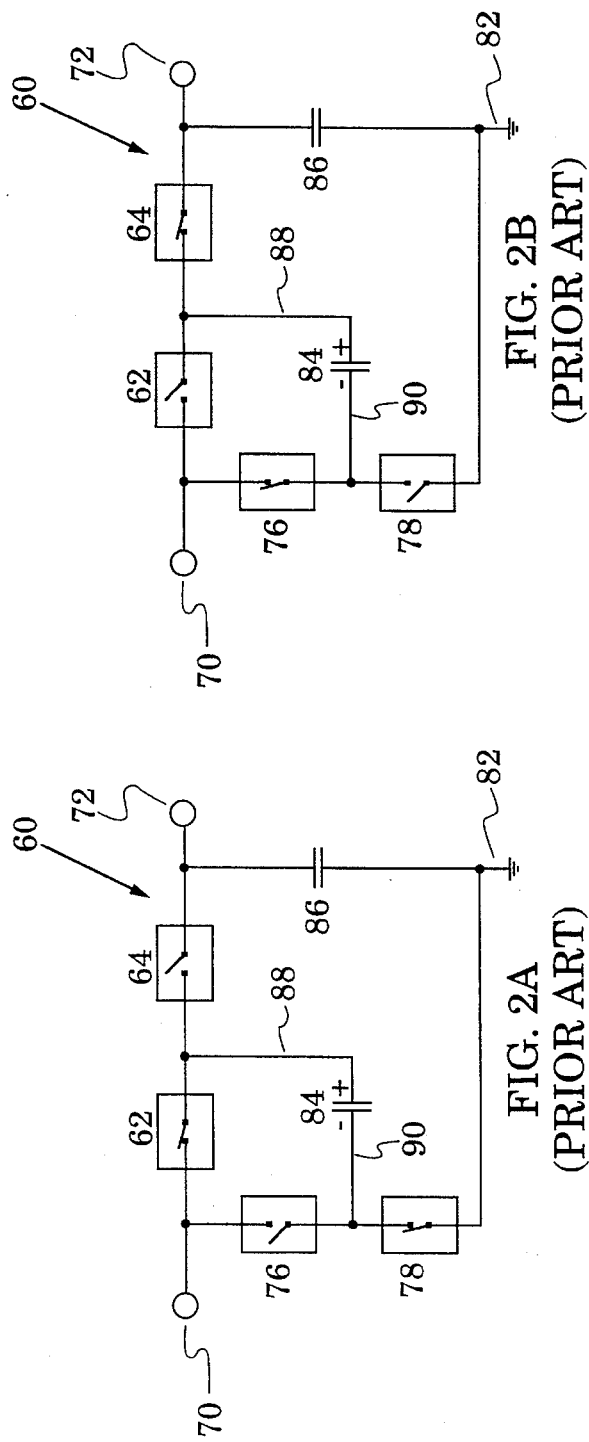
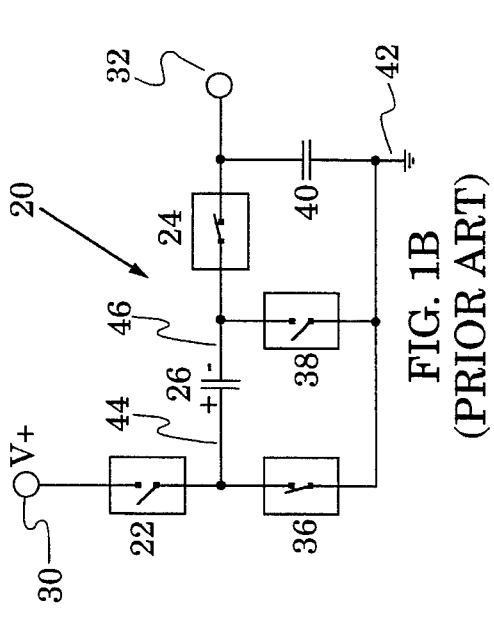
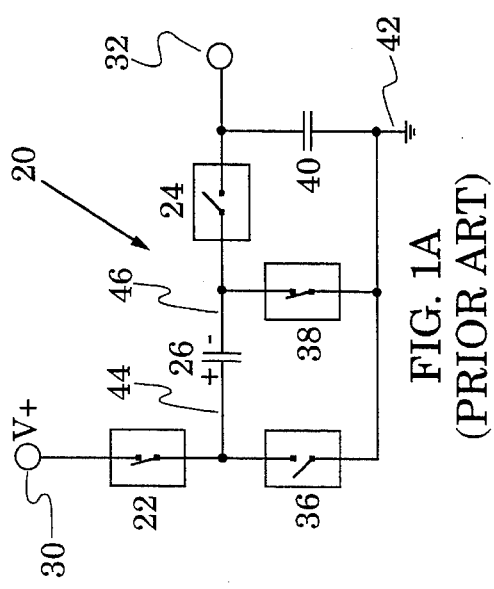

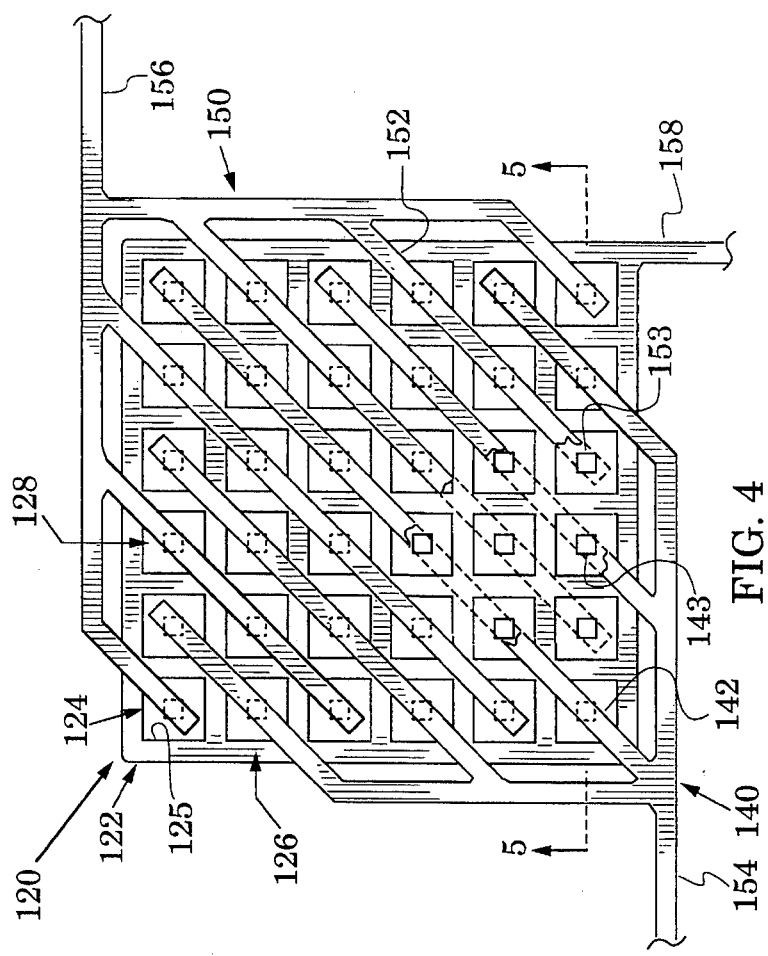
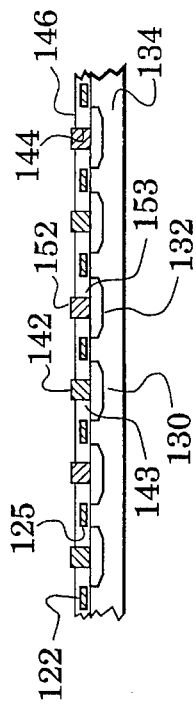
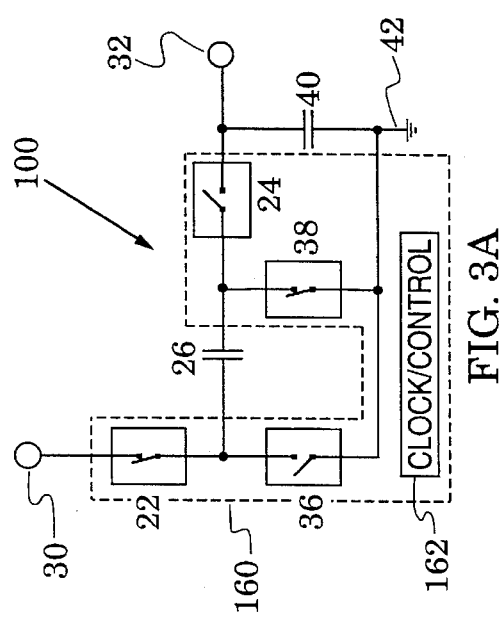
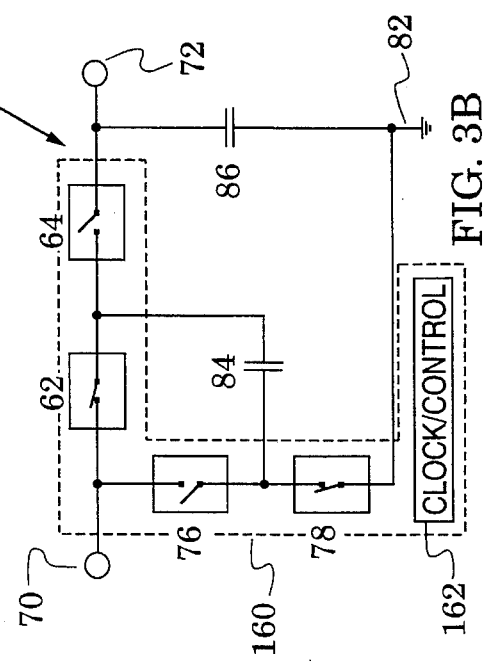

CHARGE PUMP CONVERTER STRUCTURE

BACKGROUND OF THE INVENTION

1. Field of the Invention

The present invention relates generally to DC/DC converters and more particularly to charge pump converters.

2. Description of the Related Art

Charge pumps are DC/DC converters characterized by a pump capacitor and a reservoir capacitor embedded in a switch network. The reservoir capacitor typically provides voltage and current to an external load circuit. The switch network is typically configured to conduct current between a supply voltage and the pump capacitor and subsequently conduct charge between the pump capacitor and the reservoir capacitor. The specific switch network configuration determines the amplitude and polarity of the reservoir voltage presented to the load circuit.

One specific switch configuration is illustrated in the FIGS. 1A and 1B schematics of a prior art charge pump inverter 20. These schematics show the inverter 20 in first and second operational phases. The circuit structure of the voltage inverter 20 includes switches 22, 24 and capacitor 26 arranged in series between an inverter input 30 and an inverter output 32. The switch 22 adjoins the input 30 and the capacitor 26 is disposed between the two switches. Switches 36, 38 and capacitor 40 each have one terminal connected to a ground 42 with the other switch terminals attached to opposite sides of the capacitor 26 and the other capacitor 40 terminal in common with the inverter output 32. The capacitors 26, 40 are often respectively termed the pump capacitor and the reservoir capacitor and the input 30 is typically attached to a voltage supply V+.

In operation, the switches of the inverter 20 are opened and closed in two phases. In the first phase illustrated in FIG. 1A, switches 22 and 38 are closed and switches 24 and 36 are open. In the second phase illustrated in FIG. 1B, switches 22 and 38 are open and switches 24 and 36 are closed.

In FIG. 1A, the voltage on reservoir capacitor 40 is supplied to any circuit attached to the inverter output 32 and the capacitor is isolated from the remainder of the circuit. In this phase, the voltage V+ at the inverter input 30 supplies charge to the capacitor 26 until it develops a voltage V+ across it with the positive potential on the capacitor lead 44. When the switches 22, 24, 36 and 38 are changed to the second phase positions of FIG. 1B, the capacitor lead 44 is connected to the ground 42 so that, with respect to ground, a V− potential is established at the capacitor lead 46. The capacitors 26, 40 are now in parallel and the lead 46 is in common with the output 32. During this second phase, the capacitor 26 pumps charge into the reservoir capacitor 40 causing its potential to approach V−.

It is apparent, therefore, that the reservoir capacitor 40 has a voltage of approximately V− at the beginning of each first phase illustrated in FIG. 1A and the amplitude of this voltage decays during each first phase in accordance with the current demand of the circuit attached to the output 32. During the second phase illustrated in FIG. 1B, the pump capacitor 26 pumps charge into the reservoir capacitor 40 causing its voltage to again approach V−. In a similar manner, the voltage amplitude across capacitor 26 decays during the second phase as it pumps the reservoir capacitor 40 and then rises again to V− during the first phase. Thus, the voltage across both capacitors 26, 40 exhibits a ripple whose amplitude is a function of the load current and the size of the capacitors. As a consequence of the operational phases described above, a circuit connected to the output 32 is supplied with a voltage that is opposite and approximately equal to the voltage supply at the input 30.

Another specific switch configuration is illustrated in the FIGS. 2A and 2B schematics of a prior art charge pump doubler 60. Similar to the FIGS. 1A and 1B schematics, these doubler schematics show first and second operational phases. The charge pump doubler 60 includes switches 62, 64 arranged in series between a doubler input 70 and a doubler output 72. Another pair of switches 76, 78 are arranged in series and disposed between the input 70 and a ground 82. Switches 62 and 76 adjoin the input 70. A capacitor 84 has one terminal connected to the junction of switches 62, 64 and the other to the junction of switches 76, 78. A capacitor 86 is disposed between the output 72 and ground 82. The input 70 is connected to a voltage supply V+. In this circuit structure, the pump and reservoir terms can be respectively applied to the capacitor 80 and the capacitor 86.

In the first operational phase of FIG. 2A, the switches 62, 78 are closed and the switches 64, 76 are open. In the second phase shown in FIG. 2B, switches 62, 78 are open and switches 64, 76 are closed. In FIG. 2A, the voltage on capacitor 86 is supplied to the load circuit attached to the doubler output 72 while the voltage V+ at the doubler input 70 delivers charge to the capacitor 84. A voltage V+ is developed across the capacitor 84 with a positive potential on the capacitor lead 88 relative to the opposite lead 90.

When the switches are changed to the second phase positions of FIG. 2B, the capacitor leads 90, 88 are respectively connected to the input 70 and the output 72. The potential on the capacitor 84 now adds to the input voltage V+ to place a voltage 2 V+ at the output 72. During this second phase, the capacitor 84 pumps charge into the reservoir capacitor 86 causing its potential to approach 2 V+.

Therefore, the reservoir capacitor 86 has a voltage of approximately 2 V+ at the beginning of each first phase illustrated in FIG. 2A. This voltage amplitude decays during each first phase in accordance with the current demand of the circuit attached to the output 72. During the second phase illustrated in FIG. 2B, the pump capacitor 84 pumps charge into the reservoir capacitor 86 causing its voltage to again approach 2 V+. Similarly, the voltage across capacitor 84 decays during the second phase as it pumps the reservoir capacitor 86 and then rises again to 2 V during the first phase. As a consequence of the operation of the doubler circuit 60, a circuit connected to the output 72 is supplied with a voltage approximately twice the amplitude of the voltage supply at the input 70.

Although the circuits 20, 60 illustrated in FIGS. 1A–2B are shown to have a source voltage V+ attached to their inputs, it should be apparent that nonpolarized capacitors allow them to operate with a source voltage of either polarity. In practice, the two described phases of these circuits are typically separated by a comparatively short transitional phase to accommodate circuit switching times and protect circuit elements. For example, the voltage source V+ at the circuit input 30 of FIG. 1A would be shorted to ground if switch 36 moved to its FIG. 1B position prior to the same move by switch 22. Thus, in the transitional phase, switch 22 is first opened and switch 36 is subsequently closed.

Other exemplary switch network configurations are directed to the generation of different output voltages as a function of the source voltage, e.g., a selectable bipolar doubled output voltage. U.S. Patent directed to charge pump structures include 4,636,930; 4,679,134; 4,777,577; 4,797,899; 4,809,152; 4,897,774 and 5,237,209.

SUMMARY OF THE INVENTION

The present invention is directed to improved charge pump structures. In particular, the invention provides more efficient charge pump structures through the use of superior quality switch networks.

Apparatus in accordance with the invention are characterized by a pump capacitor and a reservoir capacitor embedded in a switch network of MOS transistors. The switch network is configured to isolate the pump capacitor from the reservoir capacitor in a first switching phase and join them in a second switching phase. The network is further configured to conduct electrical charge between the supply source and the pump capacitor in the first switching phase and to conduct electrical charge between the pump capacitor and the reservoir capacitor in the second switching phase.

In accordance with a feature of the invention, each MOS transistor includes a planar gate configured to define a two dimensional array of spaced apertures and further includes a plurality of source and drain regions each disposed beneath a different one of the apertures. Such structures encourage radial current flow from each source to a plurality of surrounding drains to achieve a low resistance therebetween from a given structure area.

Each of the source regions and drain regions includes a contact electrically joined thereto. In a preferred embodiment, each of the MOS transistors is fabricated in accordance with the design rules of a CMOS fabrication process appropriate for the potential differential seen by the switch network and the spacing between the gate and the contact of each of the source regions and drain regions is the minimum allowed by those design rules.

The switch network has a most positive potential $V_{DD}$ and a most negative potential $V_{SS}$. In a preferred embodiment, a plurality of diodes are arranged to prevent any of the source regions and drain regions from substantially exceeding $V_{DD}$ or dropping substantially below $V_{SS}$.

Charge pumps formed with these switch structures provide a low source resistance to a load circuit and are especially suited for miniaturized circuits where high converter efficiency and minimal circuit area are desirable features.

The novel features of the invention are set forth with particularity in the appended claims. The invention will be best understood from the following description when read in conjunction with the accompanying drawings.

BRIEF DESCRIPTION OF DRAWINGS

FIG. 1A is a schematic of a prior art charge pump voltage inverter shown in a first phase;

FIG. 1B is a schematic of the charge pump voltage inverter of FIG. 1A shown in a second phase;

FIG. 2A is a schematic of a prior art charge pump voltage doubler shown in a first phase;

FIG. 2B is a schematic of the charge pump voltage doubler of FIG. 2A shown in a second phase;

FIG. 3A is a schematic of a charge pump voltage inverter in accordance with the present invention;

FIG. 3B is a schematic of a charge pump voltage doubler in accordance with the present invention;

FIG. 4 is a plan view of the MOS structure of each switch in the charge pump inverter of FIG. 3A and the charge pump doubler of FIG. 3B;

FIG. 5 is a view along the plane 5—5 of FIG. 4;

DESCRIPTION OF THE PREFERRED EMBODIMENTS

Figure 6:
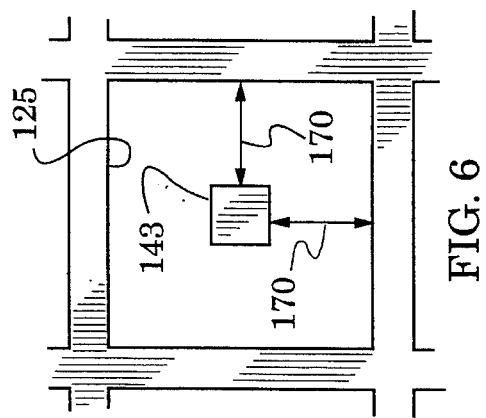
FIG. 6 is an enlarged view of a gate aperture in the structure of FIG. 4.

As stated in the description of related art, the circuits 20, 60 illustrated in FIGS. 1A–2B are examples of a class of DC/DC converter circuits typically called charge pumps. Charge pumps are characterized by a pump capacitor and a reservoir capacitor embedded in a switch network. The reservoir capacitor provides voltage and current to a load circuit while the pump capacitor first draws current from a supply voltage and subsequently pumps charge to the reservoir capacitor. In general, the switch network alternates between a first phase where it isolates the pump capacitor from the reservoir capacitor and a second phase where it joins them together. In the same sequence, the switch network alternates between conducting electrical charge from the supply voltage to the pump capacitor and conducting electrical charge from the pump capacitor to the reservoir capacitor.

It is a significant feature of charge pumps that they typically convert an input DC voltage to a different output DC voltage by using only capacitors and a switch network, i.e., circuit elements typically used in other DC/DC converters such as diodes, inductors and transformers are not required (for examples of other DC/DC converter structures see *The Electrical Engineering Handbook*, Richard C. Dorf, et al., CRC Press, Ann Arbor, 1993, pp. 708–711). Charge pumps, therefore, are especially suited for use in miniaturized circuits where small size and compatibility with integrated circuit fabrication are advantageous features.

The performance of charge pumps, as exemplified by the circuits illustrated in FIGS. 1A–2B, is directly related to the quality of the circuit switches. If the switches have a high "on" resistance, the output voltage amplitude will be reduced and the output ripple will be increased. Under dynamic load conditions, the effective charge pump source resistance seen by the load circuit will be increased, i.e., the converter efficiency is reduced. In the case of miniaturized circuit applications, another desirable feature of charge pumps is that they use the smallest possible amount of circuit real estate. A need thus exists for charge pump switch structures that can achieve reduced resistance while minimizing their structure area.

Realizing charge pumps with switch networks that have the attributes described above is an objective of the present invention. Accordingly, a preferred charge pump inverter embodiment 100 and a preferred charge pump doubler embodiment 110, in accordance with the present invention, are illustrated in FIGS. 3A–6. The circuit arrangement shown for the inverter 100 in FIG. 3A is the same as that of the inverter 20 of FIGS. 1A, 1B and the circuit arrangement shown for the doubler 110 in FIG. 3B is the same as that of the doubler 60 of FIGS. 2A, 2B. Consequently, the same reference numbers are used for the circuit elements. However, in these preferred embodiments, the structure of switches 22, 24, 36, 38 of FIG. 3A and 62, 64, 76 and 78 of FIG. 3B are configured in accordance with the metal oxide silicon (MOS) transistor 120 of FIGS. 4 and 5. FIG. 4 is a plan view of the transistor's MOS structure while FIG. 5 is a view along the plane 5—5 of FIG. 4.

As shown in the plan view of FIG. 4, the transistor 120 has a planar gate 122 which defines a two dimensional array 124 of apertures 125. In the preferred transistor embodiment 120, the apertures 125 are arranged to define orthogonally arranged rows 126 and columns 128. To reduce the gate resistance, it is preferably formed of silicided polysilicon so as to take advantage of that material's low sheet resistance. The polysilicon gate 122 may also be used as a mask for simultaneously diffusing the source regions 130 and drain regions 132 into the substrate 134. Thus, as shown in FIG. 5, the edges of these diffused regions are substantially aligned vertically with the edges of the gate apertures 125 (for a discussion of silicided polysilicon and its use as a diffusion mask see *Principles of CMOS VLSI Design*, Neil Weste, et al., Addison-Wesley Publishing, New York, 1993, pp. 113–116 & 132–133).

FIG. 5 illustrates that the diffused source regions 130 alternate with diffused drain regions 132 along each row 126. If the viewing plane 5—5 were orthogonally rotated in FIG. 4, the structure of FIG. 5 would remain the same, i.e., sources and drains alternate along both rows 126 and columns 128 of the gate apertures 125.

A metal, e.g., aluminum, source contact structure 140 includes fingers 142 arranged at an angle relative to the gate rows 126 and columns 128. The fingers 142 cross above the gate 120 but include portions in the form of contacts 143 that descend through windows 144 in the silicon dioxide insulation 146 to electrically join each source region 130. A similar metal drain contact structure 150 has fingers 152 that are arranged interdigitally with the source fingers 142. The drain fingers 152 also pass over the gate 120 and include contacts 153 that extend downward through the windows 144 to electrically join each drain region 132. In FIG. 4, the fingers 142, 152 have been broken away to more clearly show the descending contacts 143, 153. The source contact structure 140 extends away from the source and drain regions 130, 132 in a source lead 154 and the drain contact structure 150 similarly extends thereaway in a drain lead 156. Finally, the gate 122 defines a gate lead 158.

The transistor 120 may be used to form a four switch network configuration that is comparable with both the inverter 100 and the doubler 110. This is shown as the switch configuration 160 in FIGS. 3A and 3B. In both figures, the switches are serially connected with the outer and inner nodes attached to either the charge pump input or output or to other circuit elements. Thus, in a preferred physical realization of the charge pumps 100, 110, the broken line 160 represents a single die that is fabricated to include four serially connected MOS transistors 120. In addition, a self contained clock/control circuit 162 is fabricated into the same CMOS integrated circuit die. The clock/control 162 includes an oscillator whose signals set the basic charge pump switching frequency. It also includes pulse shaping and level shifting circuits to generate the specific gate signal ($V_{GS}$) applied to each switch gate lead (158 in FIG. 4).

The MOS transistor 120 defines a structure typically referred to as "waffle switch" because of the aperture array 124 defined by the gate 122. This structure, as exemplified by the plan view of FIG. 4, disposes each interior source region 130 at the center of four surrounding drain regions 132. Thus, the current flows in a substantially radial pattern between each source and its plurality of surrounding drains. It may, therefore, be appreciated that waffle switches can be designed to achieve a low effective length L of substrate between source and drain regions and a high effective width W of substrate therebetween. For a given unit area, a high W/L quality ratio can be achieved.

The quality ratio W/L can further be increased by decreasing the spacing between the polysilicon gate 122 and each of the source and drain contacts 143, 153. FIG. 6 is an enlarged view of one of the gate apertures 125 that surrounds, for example, a source contact 143. This figure more clearly illustrates the spacing 170 between the edges of the gate aperture 125 and the contact 143. Another advantage of reducing the spacing 170 is a reduction of the substrate area occupied by the waffle transistor 120. This facilitates realizing more chips from a given wafer which translates to cost savings.

On the other hand, reduced gate-to-contact spacing 170 will degrade the electrostatic discharge (ESD) characteristics of the transistor 120. Experimental data indicates that waffle transistors exhibit superior electrostatic discharge (ESD) characteristics compared with similar sized MOS structures such as ladder configurations, e.g., see L. Baker, et al., "A Waffle Layout Technique Strengthens the ESD Hardness of the NMOS Output Transistor", 1989 EOS/ESD *Symposium Proceedings*, p 175–181. However, ESD performance degrades for any MOS structure as the structure element spacing is reduced.

In accordance with a feature of the present invention, alternative ESD protection structures are added to the transistor 120 in the form of clamp diodes to permit a reduction of the gate-to-contact spacing 170 that fully realizes the potential source to drain resistance. That is, the alternative protection structure allows the gate-to-contact spacing 170 of FIG. 6 to be reduced to the minimum obtainable by an appropriate CMOS fabrication process.

Figure 7:
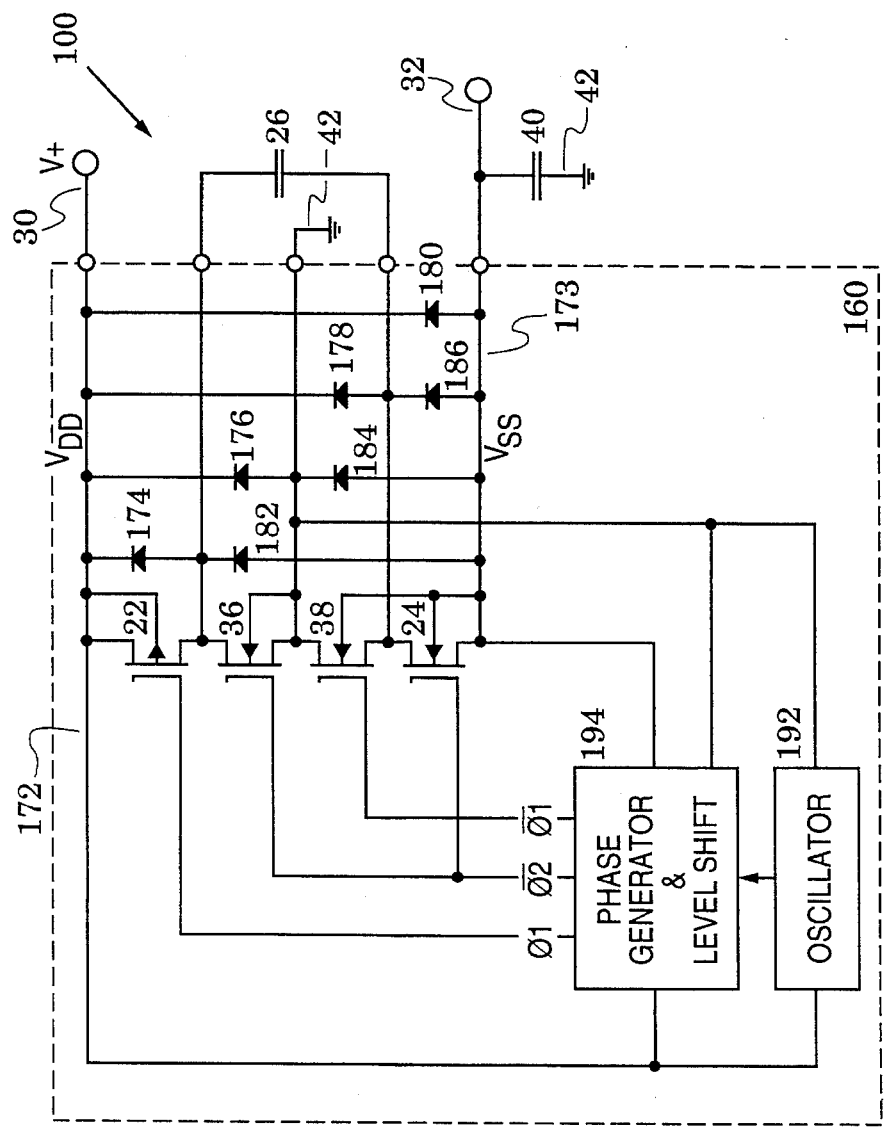
FIG. 7 is a schematic of the charge pump voltage inverter of FIG. 3A incorporating the MOS structures of FIGS. 4 and 5.

The protection structure is shown in FIG. 7 which is a more detailed schematic of the inverter circuit 100 of FIG. 3A. This schematic illustrates the four serially connected switches of FIG. 3A realized by a single p-type enhancement mode MOS transistor 22 and three n-type enhancement mode MOS transistors 24, 36 and 38. The substrate of transistor 22 is part of the basic circuit substrate which is in common with the most positive circuit potential V+. Each of the n-type transistors sets in a p-type well commonly called a "backgate" substrate. The backgate of each of these transistors is shown to be tied to the most negative potential seen during operational phases, i.e., the backgate of transistor 36 is tied to ground 42 while the backgates of transistors 24, 38 are tied to the output 32.

In FIG. 7, the rail 172 carries the most positive potential of the circuit, i.e., the input voltage source 30, while the rail 173 carries the most negative potential of the circuit, i.e., the reservoir voltage 32. The potentials of the rails 172, 173 may be represented by the common CMOS terms of $V_{DD}$ and $V_{SS}$. The protection clamp diodes referred to above are realized in the form of diffused diodes 174, 176, 178 and 180 disposed between the sources respectively of transistors 22, 36, 38 and 24 and the input 30 with their cathodes attached thereto. Thus the diodes 174, 176, 178 and 180 are arranged to prevent any source or drain potential from substantially exceeding $V_{DD}$.

Further ESD protection can be provided by diffused diodes 182, 184 and 186 disposed between the sources respectively of transistors 36, 38 and 24 and the output 32 with their anodes attached thereto. Thus the diodes 182, 184 and 186 are arranged to prevent any source or drain potential from dropping substantially below $V_{SS}$. In general, these protection diodes are connected and oriented to prevent each MOS transistor against transient voltages picked up on external leads, e.g., the input or output leads 30, 32, that would cause them to be temporarily reverse biased.

Each CMOS fabrication process typically has minimum structure spacings, i.e., design rules, for the potential differential that will be seen by a circuit. For example, if the expected differential is specified to be 10 volts, a set of design rules appropriate to that differential will apply, e.g., see *Principles of CMOS VLSI design*, Neil Weste, et al., Addison-Wesley Publishing, NEW York, 1993pp. 142–156. With these diode protection structures in place, the gate-to-contact spacing 170 can be reduced to the minimum allowed by the appropriate CMOS fabrication process.

The clock/control 162 shown in FIG. 3A is detailed in FIG. 7 as an oscillator 192 connected to a phase signal generator and level shift circuit 194. As described above, the charge pump has first and second operational phases which are realized by applying the signal Ø1 and Ø2 to the transistor gates. These are square wave signals with Ø2 the inverse of Ø1 and, preferably, with a 50% duty cycle. The gates of the n-type transistors 24, 36 are driven by the inverse of the Ø2 signal. The signal Ø1 is applied to the gate of the p-type transistor 22 while its inverse is applied to the gate of the n-type transistor 24.

After packaging, the die 160 of FIG. 7 can be mounted on a circuit board and integrated with separately packaged capacitors 26, 40. The pump capacitor 26 is disposed between the drain of transistor 24 and the source of transistor 22 while the reservoir capacitor 40 is attached to the source of transistor 24. A detailed circuit for the doubler 110 of FIG. 3B can be realized in a similar manner.

Although the preferred embodiments described above have been directed to the exemplary charge pumps of FIGS. 1A–2B, the teachings of the invention may be extended to other charge pump structures. For example, U.S. Pat. No. 5,237,209 discloses a charge pump bipolar doubler which can deliver two opposite polarity output voltages whose magnitudes are each substantially double the input voltage. Other exemplary charge pump structures are addressed in U.S. Pat. Nos. 4,636,930; 4,679,134; 4,777,577; 4,797,899; 4,809,152 and 4,897,774.

Although these specific charge pump structures typically include additional detailed circuits, they are generally characterized by the presence of pump and reservoir capacitors and a switch network which alternates between conducting electrical charge from an input source to the pump capacitor in a first operational phase and conducting electrical charge from the pump capacitor to the reservoir capacitor in a second operational phase. The pump and reservoir capacitors are thus isolated in the first phase and joined in the second. The load circuit is connected to the reservoir capacitor and specific switch network configurations provide various output voltages which are each a function of the input, e.g., inverted, doubled, bipolar and the like.

From the foregoing it should now be recognized that charge pump embodiments have been disclosed herein utilizing MOS configured waffle transistors. Embodiments in accordance with the invention are especially suited for miniaturized circuits, e.g., hand held telephones where high converter efficiency and minimal circuit area are desirable features. In these applications, exemplary switching rates range from10 to 100 kilohertz and exemplary capacitor values range from 0.1 to 100 microfarads.

The preferred embodiments of the invention described herein are exemplary and numerous modifications, dimensional variations and rearrangements can be readily envisioned to achieve an equivalent result, all of which are intended to be embraced within the scope of the appended claims.

What is claimed is:

1. An efficient charge pump inverter disposable between an electrical supply source and a load circuit, comprising:

a switch network;

a reservoir capacitor embedded in said switch network and arranged therein to be available to said load circuit for supplying current thereto; and a pump capacitor embedded in said switch network and having first and second leads;

wherein said switch network is configured to connect said first pump capacitor lead to said supply source for conduction of charge therefrom in a first switching phase and to connect said second pump capacitor lead to said reservoir capacitor for conduction of charge thereto in a second switching phase;

and said switch network is comprised of a plurality of MOS transistors wherein each of said transistors includes:

a) a planar gate configured to define a two dimensional array of spaced apertures which are orthogonally arranged in rows and columns;

b) a plurality of source regions; and c) a plurality of drain regions with each of said source regions and said drain regions positioned within a different one of said apertures and said source regions and said drain regions arranged in an alternating relationship along said rows and said columns so that current flows in a substantially radial pattern between each of said source regions and surrounding ones of said drain regions.

2. The charge pump of claim 1, wherein:

said plurality of MOS transistors includes first, second, third and fourth serially-connected MOS transistors; and said pump capacitor is coupled across said second and third MOS transistors; and said fourth MOS transistor is coupled between said pump capacitor and said reservoir capacitor.

3. An efficient charge pump doubler disposable between an electrical supply source and a load circuit, comprising:

a switch network;

a reservoir capacitor embedded in said switch network and arranged therein to be available to said load circuit for supplying current thereto; and a pump capacitor embedded in said switch network and having first and second leads;

wherein said switch network is configured to connect said first pump capacitor lead to said supply source for conduction of charge therefrom in a first switching phase and to connect said first pump capacitor lead to said reservoir capacitor and said second pump capacitor lead to said supply source in a second switching phase;

and said switch network is comprised of a plurality of MOS transistors wherein each of said transistors includes:

a) a planar gate configured to define a two dimensional array of spaced apertures which are orthogonally arranged in rows and columns;

b) a plurality of source regions; and c) a plurality of drain regions with each of said source regions and said drain regions positioned within a different one of said apertures and said source regions and said drain regions arranged in an alternating relationship along said rows and said columns so that current flows in a substantially radial pattern between each of said source regions and surrounding ones of said drain regions.

4. The charge pump of claim 3, wherein:

said plurality of MOS transistors includes first, second, third and fourth serially-connected MOS transistors; and said pump capacitor is coupled across said second and third MOS transistors; and said fourth MOS transistor is coupled between said pump capacitor and said reservoir capacitor.

* * * * *